(12) United States Patent
Kakuchi et al.

(10) Patent No.: US 7,773,233 B2
(45) Date of Patent: Aug. 10, 2010

(54) METHOD OF MEASURING WAVEFRONT RETARDANCE ABERRATION BASED ON WAVEFRONT AND BIREFRINGENT CHARACTERISTICS

(75) Inventors: Osamu Kakuchi, Kasama (JP); Yoshiyuki Kuramoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 188 days.

(21) Appl. No.: 12/112,125

(22) Filed: Apr. 30, 2008

(65) Prior Publication Data

US 2008/0273200 A1 Nov. 6, 2008

(30) Foreign Application Priority Data

May 1, 2007 (JP) ............................. 2007-121164

(51) Int. Cl.
*G01B 9/02* (2006.01)

(52) U.S. Cl. ..................................... 356/515; 356/495

(58) Field of Classification Search ................ 356/495, 356/515, 517, 512, 491, 493
See application file for complete search history.

(56) References Cited

U.S. PATENT DOCUMENTS 7,675,629 B2 * 3/2010 Ohsaki et al. ............... 356/515
2002/0024673 A1 2/2002 Ouchi

FOREIGN PATENT DOCUMENTS

JP 02-116732 A 5/1990
JP 2000-071515 A 3/2000

OTHER PUBLICATIONS

XP-002455088, Shiode et al, "Study of polarization aberration measurement using SPIN method", Proc. of SPIE vol. 6154, pp. 615431-1 to 615431-9 (2006).
European Patent Office Communication and Search Report issued Sep. 4, 2008, concerning the corresponding European Patent Application No. 08155431.3.

\* cited by examiner

*Primary Examiner*—Hwa S. A Lee
(74) *Attorney, Agent, or Firm*—Canon U.S.A., Inc. I.P. Division

(57) ABSTRACT

A measurement method of measuring a wavefront aberration of an optical system to be measured, comprising a first measurement step of measuring wavefronts of the optical system to be measured with respect to linearly polarized light beams along at least three different azimuths, a first calculation step of calculating a wavefront of the optical system to be measured with respect to non-polarized light and a birefringent characteristic of the optical system to be measured, based on the wavefronts of the optical system to be measured, which are measured in the first measurement step, and a second calculation step of calculating a wavefront of the optical system to be measured with respect to arbitrary polarized light, based on the wavefront and the birefringent characteristic of the optical system to be measured, which are calculated in the first calculation step.

6 Claims, 7 Drawing Sheets

METHOD OF MEASURING WAVEFRONT RETARDANCE ABERRATION BASED ON WAVEFRONT AND BIREFRINGENT CHARACTERISTICS

BACKGROUND OF THE INVENTION

1. Field of the Invention

The present invention relates to a measurement method, a measurement apparatus, an exposure apparatus, and a device fabrication method.

2. Description of the Related Art

In recent years, a projection optical system (projection lens) built into a projection exposure apparatus is required to have a performance high enough to suppress wavefront aberrations (transmission wavefront aberration) below 10 m$\lambda$ RMS (e.g., wavelength $\lambda$=248 nm or 193 nm). This makes it necessary to measure the wavefront aberration of the projection optical system with high precision (about 1 m$\lambda$), with the projection optical system built into the exposure apparatus. Simplification, speed-up, and the like of the measurement are also important to increase productivity.

An interferometer is used to measure the wavefront aberration of a projection optical system by measuring the wavefronts of the projection optical system at a plurality of points in its field region. The projection optical system is adjusted so as to minimize an aberration coefficient obtained by the polynomial expansion (e.g., using the Zernike function) of the wavefronts measured by the interferometer.

To improve the resolution of an exposure apparatus, polarized illumination has come to be used in place of non-polarized illumination. This makes it necessary to measure not only the wavefront aberration (non-polarization wavefront) of a projection optical system with respect to non-polarized light but also its wavefront aberration (polarization wavefront) with respect to arbitrary polarized light.

Japanese Patent Laid-Open Nos. 2-116732 and 2000-071515 propose techniques of measuring the wavefront aberration of a projection optical system with respect to arbitrary polarized light. These techniques measure the birefringent characteristics of the projection optical system to obtain its wavefront aberration with respect to arbitrary polarized light using the measured birefringent characteristics. More specifically, the technique disclosed in Japanese Patent Laid-Open No. 2-116732 measures the birefringent characteristics (the magnitude and fast axis azimuth of birefringence) of the projection optical system by guiding linearly polarized light beams along four different azimuths (e.g., 0°, 90°, 180°, and 270°) to it. Also, the technique disclosed in Japanese Patent Laid-Open No. 2000-071515 measures the non-polarization wavefront and birefringent characteristic (the magnitude of birefringence) of the projection optical system by guiding linearly polarized light beams along two different azimuths (e.g., 0° and 90°) to it.

Unfortunately, it is difficult for the conventional techniques to simply measure the wavefront aberration with respect to arbitrary polarized light in a short period of time. For example, Japanese Patent Laid-Open No. 2-116732 requires a relatively long measurement time because the wavefront aberrations with respect to linearly polarized light beams along four azimuths must be measured. Furthermore, Japanese Patent Laid-Open No. 2-116732 guides linearly polarized light beams along four different azimuths by rotating a $\lambda/2$ plate (polarization switching unit) inserted immediately after a light source. To maintain the linearly polarized light beams along four azimuths, the optical path (optical system) from the polarization switching unit to the projection optical system must have a non-polarization characteristic. It is, however, very hard to form such an optical path.

Japanese Patent Laid-Open No. 2000-071515 need only measure the wavefronts with respect to linearly polarized light beams along two azimuths. In this case, the measurement can be done in a short period of time, but the fast axis azimuth of birefringence must be known in advance. In addition, since a polarization switching unit is inserted immediately after a light source as in Japanese Patent Laid-Open No. 2-116732, the optical path (optical system) from the polarization switching unit to the projection optical system must have a non-polarization characteristic.

SUMMARY OF THE INVENTION

The present invention provides a measurement method and apparatus which can simply measure the wavefront aberration of an optical system to be measured with respect to arbitrary polarized light in a short period of time.

According to one aspect of the present invention, there is provided a measurement method of measuring a wavefront aberration of an optical system to be measured, comprising:

a first measurement step of measuring wavefronts of the optical system to be measured with respect to linearly polarized light beams along at least three different azimuths;

a first calculation step of calculating a wavefront of the optical system to be measured with respect to non-polarized light and a birefringent characteristic of the optical system to be measured, based on the wavefronts of the optical system to be measured, which are measured in the first measurement step; and a second calculation step of calculating a wavefront of the optical system to be measured with respect to arbitrary polarized light, based on the wavefront and the birefringent characteristic of the optical system to be measured, which are calculated in the first calculation step.

According to another aspect of the present invention, there is provided a measurement apparatus which measures a wavefront aberration of an optical system to be measured, comprising:

a condensing optical system which is inserted on a side of an object plane of the optical system to be measured, and is configured to converge a certain component of light from a light source on the object plane of the optical system to be measured to guide the certain component to the optical system to be measured, and to reflect the remaining component of the light from the light source without guiding the remaining component to the optical system to be measured;

a catoptric system which is inserted on a side of an image plane of the optical system to be measured, and is configured to reflect the certain component of the light, which is guided to the optical system to be measured by the condensing optical system and has passed through the optical system to be measured, to guide the certain component to the optical system to be measured;

a detection unit configured to detect an interference pattern obtained upon interference between the light component reflected by the condensing optical system and the light component which is guided to the optical system to be measured by the catoptric optical system and has passed through the optical system to be measured; and a polarization changing unit which is inserted between the condensing optical system and the light source, and is configured to change a polarization state of the light which enters the condensing optical system.

According to still another aspect of the present invention, there is provided an exposure apparatus comprising:

an illumination optical system configured to illuminate a reticle with light from a light source;

a projection optical system configured to project a pattern of the reticle onto a substrate; and a measurement apparatus configured to measure a wavefront aberration of the projection optical system as an optical system to be measured, wherein the measurement apparatus includes the above mentioned measurement apparatus.

According to yet another aspect of the present invention, there is provided a device fabrication method comprising steps of exposing a substrate using the above exposure apparatus, and performing a development process for the substrate exposed.

Further features of the present invention will become apparent from the following description of exemplary embodiments with reference to the attached drawings.

DESCRIPTION OF THE EMBODIMENT

Figure 1:
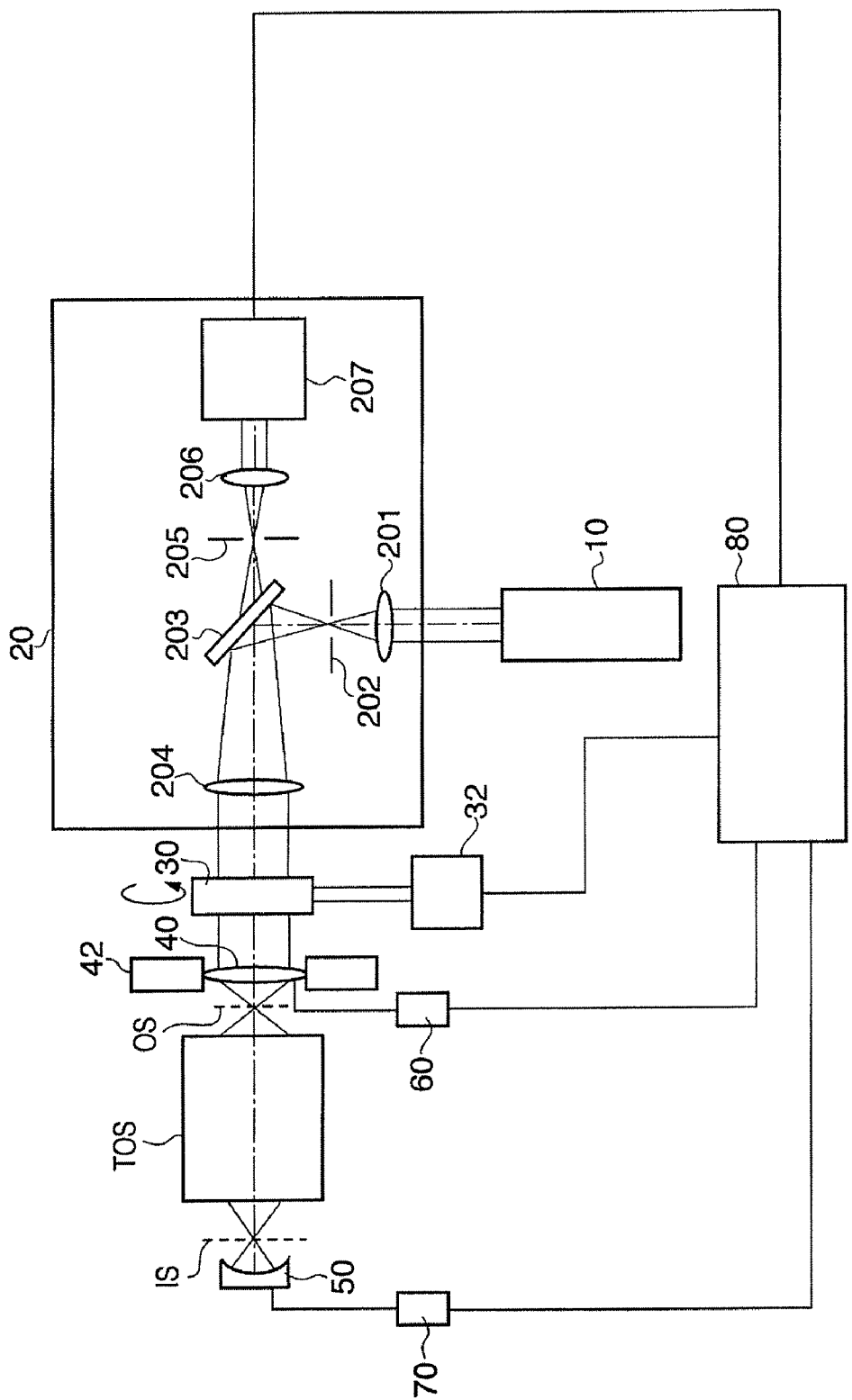
FIG. 1 is a schematic block diagram showing a measurement apparatus according to one aspect of the present invention.

A preferred embodiment of the present invention will be described below with reference to the accompanying drawings. The same reference numerals denote the same members throughout the drawings, and a repetitive description thereof will be omitted.

FIG. 1 is a schematic block diagram showing the arrangement of a measurement apparatus 1 according to one aspect of the present invention. The measurement apparatus 1 measures the optical performance of an optical system TOS to be measured. In this embodiment, a projection optical system for use in an exposure apparatus is assumed as the optical system TOS to be measured, and the measurement apparatus 1 measures the wavefront aberration of the projection optical system with respect to arbitrary polarized light. The measurement apparatus 1 basically takes the Fizeau interferometer arrangement and includes a light source 10, interferometer unit 20, λ/2 plate 30, TS lens 40, RS mirror 50, lens position measurement unit 60, mirror position measurement unit 70, and control unit 80, as shown in FIG. 1.

The light source 10 is similar to that of an exposure apparatus which uses a projection optical system as the optical system TOS to be measured. The light source 10 is embodied as, for example, a laser light source with a good coherency and an oscillation wavelength nearly equal to the wavelength of light for use in the optical system TOS to be measured. Light from the light source 10 is guided to the interferometer unit 20.

The interferometer unit 20 serves as a detection unit which detects an interference pattern obtained upon interference between light (reference light) reflected by the TS lens 40 (to be described later) and light (measurement light) which is reflected by the RS mirror 50 (to be described later) and has passed through the optical system TOS to be measured. In this embodiment, the interferometer unit 20 includes a condenser lens 201, spatial filter 202, half mirror 203, collimator lens 204, spatial filter 205, imaging lens 206, and CCD camera 207.

The measurement light which passes through the optical system TOS to be measured will be explained first. Light from the light source 10 is converged on the spatial filter 202 via the condenser lens 201 in the interferometer unit 20. The spatial filter 202 has a diameter about ½ that of an airly disk, which is determined by the numerical aperture (NA) of the collimator lens 204. The light which emerges from the spatial filter 202 turns into an ideal spherical wave, is reflected by the half mirror 203, and is guided to the collimator lens 204. The light which enters the collimator lens 204 is converted into parallel light and emerges from the interferometer unit 20.

The λ/2 plate 30 is inserted between the interferometer unit 20 and the TS lens 40 and, more specifically, immediately after (i.e., immediately before the TS lens 40) the interferometer unit 20. The interferometer unit 20 (from the condenser lens 201 to the λ/2 plate 30) may be an optical system (optical path) with a polarization characteristic, which allows easy formation of the interferometer unit 20. However, the λ/2 plate 30 may be inserted immediately after the light source 10 as long as the interferometer unit 20 can be formed as an optical system with a non-polarization characteristic.

The λ/2 plate 30 is connected to a rotating mechanism 32 and can rotate about the optical axis. This makes it possible to rotate the fast axis azimuth of the λ/2 plate 30 in an arbitrary direction so that light (light guided to the TS lens 40) which emerges from the interferometer unit 20 can be controlled into linearly polarized light beams along arbitrary azimuths (e.g., at least three different azimuths). In other words, the λ/2 plate 30 serves as a polarization changing unit which changes the polarization state of light which enters the TS lens 40 (optical system TOS to be measured). However, the polarization changing unit is not particularly limited to the λ/2 plate 30, and may be other optical members which can change the light polarization state. The light converted into linearly polarized light beams along predetermined azimuths by the λ/2 plate 30 enters the TS lens 40 while maintaining this polarization state.

A certain component of the light having entered the TS lens 40 is converged on an object plane (reticle surface) OS of the optical system TOS to be measured via the TS lens 40. The TS lens 40 is inserted on the side of the object plane OS of the optical system TOS to be measured, and serves as a condensing optical system which converges light emitted by the interferometer unit 20 (light source 10) on the object plane OS of the optical system TOS to be measured.

The light converged on the object plane OS of the optical system TOS to be measured passes through the optical system TOS to be measured, forms an image on an image plane (wafer surface) IS, and is reflected by the RS mirror 50. The RS mirror 50 is inserted on the side of the image plane IS of the optical system TOS to be measured, and serves as a catoptric system which reflects light having passed though the optical system TOS to be measured to guide it to the optical system TOS to be measured. The light reflected by the RS mirror 50 retraces the optical system TOS to be measured, TS lens 40, and λ/2 plate 30 along nearly the same optical path, and enters the interferometer unit 20.

The light which has passed through the optical system TOS to be measured and entered the interferometer unit 20 is transmitted through the collimator lens 204 and half mirror 203 and converged on the spatial filter 205. The spatial filter 205 has a function of shielding any stray light and steeply inclined wavefront. The light having passed through the spatial filter 205 enters the CCD camera 207 as parallel light via the imaging lens 206.

The reference light will be explained next. The reference light is obtained by reflecting the remaining component of the light having entered the TS lens 40 from the interferometer unit 20. In this embodiment, the light reflected by the Fizeau surface as the final surface of the TS lens 40 retraces the same optical path (collimator lens 204, half mirror 203, spatial filter 205, and imaging lens 206) as that of the measurement light, and enters the CCD camera 207 as the reference light. In other words, the TS lens 40 serving as a condensing optical system also has a function of reflecting the remaining component of the light emitted by the interferometer unit 20 (light source 10) without guiding it to the optical system TOS to be measured.

An interference pattern is formed in the CCD camera 207 upon interference (superposition) between the measurement light and the reference light, and the CCD camera 207 detects the interference pattern. The interference pattern detected by the CCD camera 207 is sent to the control unit 80. The TS lens 40 can be scanned in the optical axis direction by a scanning mechanism 42 including, for example, a piezoelectric (PZT) element. Hence, the measurement apparatus 1 can measure the wavefront of the optical system TOS to be measured with high precision by the so-called fringe scanning.

The lens position measurement unit 60 measures the position of the TS lens 40 serving as a condensing optical system (more specifically, the position of the TS lens 40 relative to the optical system TOS to be measured in the X, Y, and Z directions), and sends the measurement result (the position of the TS lens 40) to the control unit 80. In this embodiment, the lens position measurement unit 60 serves as a first measurement unit which measures the position of the TS lens 40 in measuring the wavefront of the optical system TOS to be measured. The lens position measurement unit 60 includes, for example, a reference mirror and laser interferometer. However, the lens position measurement unit 60 can take any form known to those skilled in the art, and a detailed description of the structure and operation thereof will not be given herein.

The mirror position measurement unit 70 measures the position of the RS mirror 50 serving as a catoptric system (more specifically, the position of the RS mirror 50 relative to the optical system TOS to be measured in the X, Y, and Z directions), and sends the measurement result (the position of the RS mirror 50) to the control unit 80. In this embodiment, the mirror position measurement unit 70 serves as a second measurement unit which measures the position of the RS mirror 50 in measuring the wavefront of the optical system TOS to be measured. The mirror position measurement unit 70 includes a reference mirror and laser interferometer as in the lens position measurement unit 60. However, the mirror position measurement unit 70 can take any form known to those skilled in the art, and a detailed description of the structure and operation thereof will not be given herein.

The control unit 80 includes a CPU and memory (not shown) and controls the operation of the measurement apparatus 1. In this embodiment, the control unit 80 is electrically connected to the CCD camera 207, rotating mechanism 32, lens position measurement unit 60, and mirror position measurement unit 70. The control unit 80 can control the rotating mechanism 32 to guide linearly polarized light along a predetermined azimuth to the optical system TOS to be measured. In this embodiment, the control unit 80 guides linearly polarized light beams along at least three different azimuths to the optical system TOS to be measured. The control unit 80 calculates the wavefront aberration of the optical system TOS to be measured (in this embodiment, the polarization wavefront of the optical system TOS to be measured with respect to arbitrary polarized light), based on the measurement result obtained by the lens position measurement unit 60, the measurement result obtained by the mirror position measurement unit 70, and/or the interference pattern detected by the CCD camera 207.

As a process of calculating the polarization wavefront of the optical system TOS to be measured, first, the control unit 80 executes a first measurement step of measuring the wavefronts (non-polarization wavefronts) of the optical system TOS to be measured with respect to linearly polarized light beams along at least three different azimuths. Next, the control unit 80 executes a first calculation step of calculating the wavefront and birefringent characteristics of the optical system TOS to be measured with respect to non-polarized light, based on the wavefronts of the optical system TOS to be measured, which are measured in the first calculation step. Lastly, the control unit 80 executes a second calculation step of calculating the wavefront (polarization wavefront) of the optical system TOS to be measured with respect to arbitrary polarized light, based on the wavefront and birefringent characteristics of the optical system TOS to be measured, which are calculated in the first calculation step. The control unit 80 often executes a second measurement step of measuring the positions of the TS lens 40 and RS mirror 50 in measuring the wavefront of the optical system TOS to be measured, as will be described later.

Figure 2:
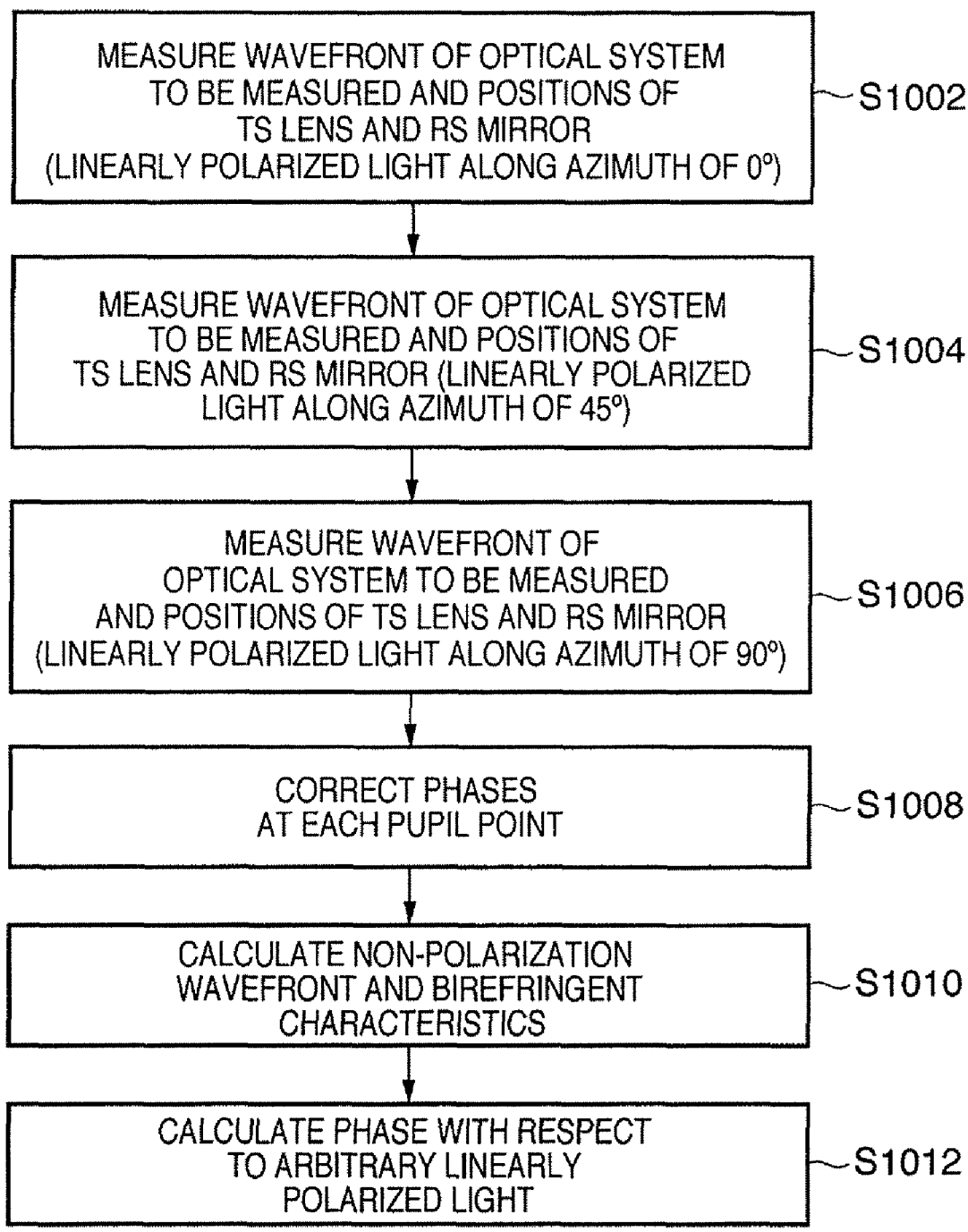
FIG. 2 is a flowchart for explaining a measurement method according to one aspect of the present invention.

A process of calculating the polarization wavefront of the optical system TOS to be measured by the control unit 80 (i.e., a measurement method of measuring the wavefront aberration of the optical system TOS to be measured by the measurement apparatus 1) will be explained in detail below, together with the measurement operation of the measurement apparatus 1. FIG. 2 is a flowchart for explaining a measurement method of measuring the wavefront aberration of the optical system TOS to be measured by the measurement apparatus 1.

Referring to FIG. 2, in step S1002, the wavefront of the optical system TOS to be measured with respect to linearly polarized light along an azimuth of 0° is measured, and the positions (the positions in the X, Y, and Z directions) of the TS lens 40 and RS mirror 50 are measured. More specifically, the control unit 80 rotates the λ/2 plate 30 via the rotating mechanism 32 to guide linearly polarized light along an azimuth of 0° to the optical system TOS to be measured. In this state, an interference pattern is detected by the CCD camera 207 using the fringe scanning method, and the wavefront of the optical system TOS to be measured is calculated based on the interference pattern. At the same time, the positions of the TS lens 40 and RS mirror 50 while the wavefront of the optical system TOS to be measured with respect to linearly polarized light along an azimuth of 0° is measured are measured using the lens position measurement unit 60 and mirror position measurement unit 70.

In step S1004, the wavefront of the optical system TOS to be measured with respect to linearly polarized light along an azimuth of 45° is measured, and the positions of the TS lens 40 and RS mirror 50 are measured. In step S1006, the wavefront of the optical system TOS to be measured with respect to linearly polarized light along an azimuth of 90° is measured, and the positions of the TS lens 40 and RS mirror 50 are measured. More specifically, in steps S1004 and S1006, the control unit 80 rotates the λ/2 plate 30 via the rotating mechanism 32 to guide linearly polarized light along an azimuth of 45° or 90° to the optical system TOS to be measured, thereby calculating the wavefront of the optical system TOS to be measured. As in step S1002, the positions of the TS lens 40 and RS mirror 50 while the wavefront of the optical system TOS to be measured with respect to an azimuth of 45° or 90° is measured are measured.

The reason why the positions of the TS lens 40 and RS mirror 50 are measured in steps S1002, S1004, and S1006 will now be explained. If the positions of the TS lens 40 and RS mirror 50 in measuring the wavefront in step S1004 or S1006 shift relative to those of the TS lens 40 and RS mirror 50 in measuring the wavefront in step S1002, this positional shift becomes an error when calculating the polarization wavefront. More specifically, tilt components and defocus components are generated in the wavefronts of the optical system TOS to be measured, which are measured in steps S1004 and/or S1006. These components translate into errors when calculating the polarization wavefront of the optical system TOS to be measured. If the TS lens 40 and/or RS mirror 50 shift in the X and Y directions, a tilt component is generated in the wavefront of the optical system TOS to be measured. If the TS lens 40 and/or RS mirror 50 shift in the Z direction, a defocus component is generated in the wavefront of the optical system TOS to be measured. To solve this problem, the positions of the TS lens 40 and RS mirror 50 are measured to correct a tilt component and defocus component generated in the wavefront of the optical system TOS to be measured when the TS lens 40 and/or RS mirror 50 shift (step S1008).

In step S1008, the phases of the wavefronts of the optical system TOS to be measured, which are obtained in steps S1002, S1004, and S1006, at each pupil point of the optical system TOS to be measured are corrected. More specifically, the positions of the TS lens 40 and RS mirror 50 measured in steps S1002, S1004, and S1006 are converted into wavefront tilt components and defocus components, and the phase correction amounts at each pupil point are calculated. The calculated phase correction amounts are added to the phases of the wavefronts of the optical system TOS to be measured, which are obtained in steps S1002, S1004, and S1006. This attains phase correction at each pupil point of the optical system TOS to be measured.

For example, let $(\Delta Xts, \Delta Yts, \Delta Zts)$ and $(\Delta Xrs, \Delta Yrs, \Delta Zrs)$ be the positions of the TS lens 40 and RS mirror 50 in step S1004 relative to those of the TS lens 40 and RS mirror 50 in step S1002. Then, a wavefront change amount $Wts(x,y)$ due to the positional shift of the TS lens 40 is given by:

$$Wts(x,y) = C2ts \cdot x + C3ts \cdot y + C4ts \cdot z \quad (1)$$

A wavefront change amount $Wrs(x,y)$ due to the positional shift of the RS mirror 50 is given by:

$$Wrs(x,y) = C2rs \cdot x + C3rs \cdot y + C4rs \cdot z \quad (2)$$

In equations (1) and (2), the first and second terms are wavefront tilt components and the third term is a wavefront defocus component. C2ts, C3ts, and C4ts are given by:

$$C2ts = NAts \cdot \Delta Xts \quad (3)$$

$$C3ts = NAts \cdot \Delta Yts \quad (4)$$

$$C4ts = NAts^2 \cdot \Delta Zts/2 \quad (5)$$

where NAts is the numerical aperture of the optical system TOS to be measured on the side of the TS lens 40 (object plane side). C2rs, C3rs, and C4rs are given by:

$$C2rs = NArs \cdot \Delta Xrs \quad (6)$$

$$C3rs = NArs \cdot \Delta Yrs \quad (7)$$

$$C4rs = NArs^2 \cdot \Delta Zrs/2 \quad (8)$$

where NArs is the numerical aperture of the optical system TOS to be measured on the side of the RS mirror 50 (image plane side).

Let $W22(x,y)$ be the wavefront of the optical system TOS to be measured, which is obtained in step S1004. Then, correcting the phase at each pupil point (x,y) of the optical system TOS to be measured in step S1008 can yield a corrected wavefront $W22'(x,y)$ of the optical system TOS to be measured:

$$W22'(x,y) = W22(x,y) + Wts(x,y) + Wrs(x,y) \quad (9)$$

Likewise, the phase of the wavefront of the optical system TOS to be measured, which is obtained in step S1006, at each pupil point of the optical system TOS to be measured is corrected by the above-described procedure.

Figure 3:
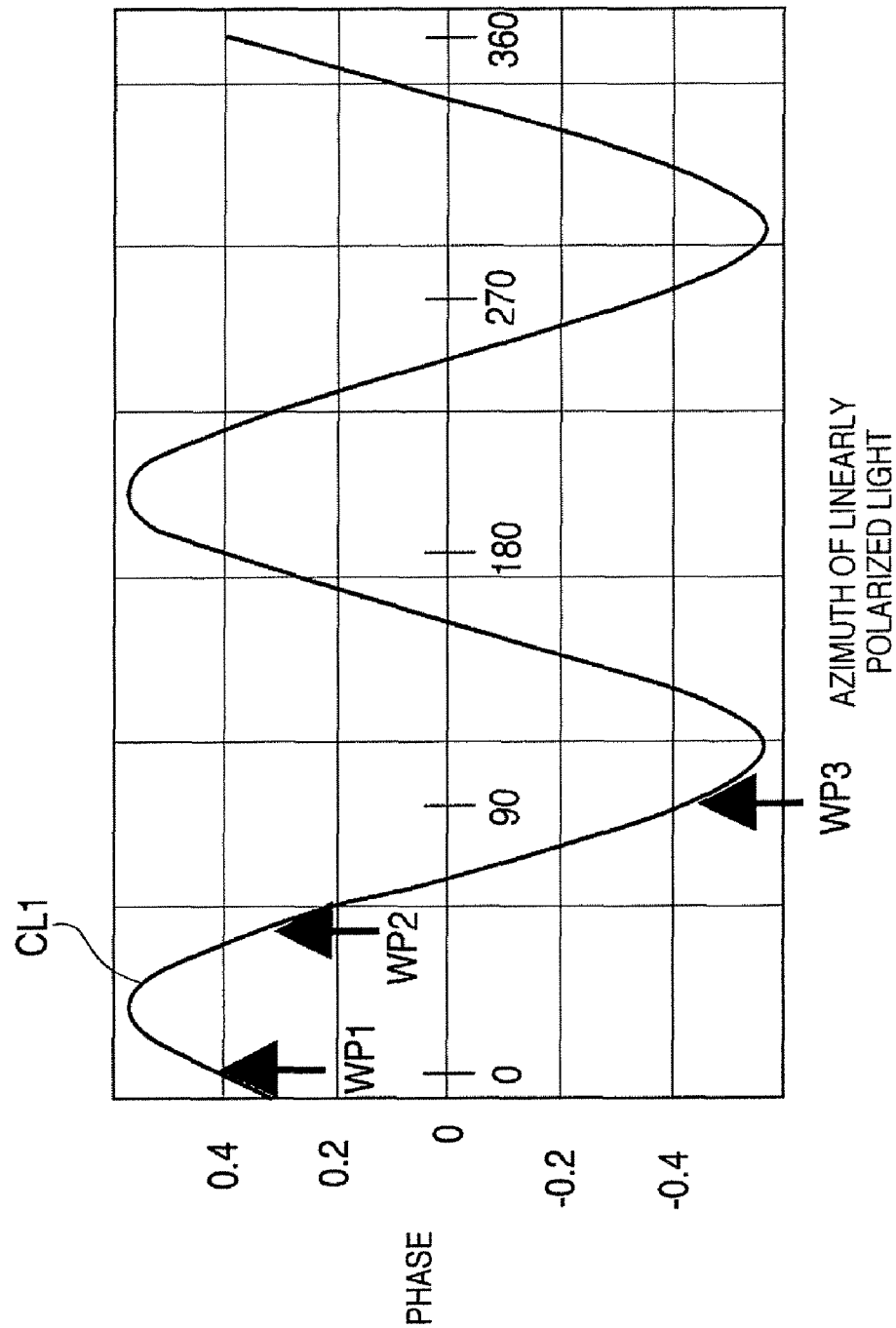
FIG. 3 is a graph showing the relationship between the azimuth of linearly polarized light which enters an optical system to be measured and the wavefront phase of the optical system to be measured.

In step S1010, the control unit 80 calculates the wavefront (non-polarization wavefront) and birefringent characteristics of the optical system TOS to be measured with respect to non-polarized light, based on the wavefronts of the optical system TOS to be measured at its each pupil point, which are corrected in step S1008. The magnitude of retardation and the fast axis azimuth of birefringence are calculated as birefringent characteristics. More specifically, the wavefront phases of the optical system TOS to be measured with respect to linearly polarized light beams along azimuths of 0°, 45°, and 90° at a certain pupil point of the optical system TOS to be measured, which are corrected in step S1008, are indicated by phases WP1, WP2, and WP3 in FIG. 3. Assuming that the optical system TOS to be measured exhibits a uniaxial birefringent characteristic, the phases WP1, WP2, and WP3 are plotted on a sine wave (sine curve) CL1, as shown in FIG. 3. Hence, a phase φ of the wavefront of the optical system TOS to be measured can be expressed as a function of an azimuth θ of linearly polarized light which enters the optical system TOS to be measured:

$$\phi(\theta) = A \cdot \sin(\theta + \theta_0) + B \quad (10)$$

where $\theta_0$ is the fast axis azimuth, A is the magnitude of retardation, and B is the non-polarization wavefront.

FIG. 3 is a graph showing the relationship between the azimuth of linearly polarized light which enters the optical system TOS to be measured and the wavefront phase of the optical system TOS to be measured (the wavefront phases of the optical system TOS to be measured, which are corrected in step S1008). In FIG. 3, the abscissa indicates the azimuth of linearly polarized light which enters the optical system TOS to be measured, and the ordinate indicates the wavefront phase of the optical system TOS to be measured.

The control unit 80 can calculate the non-polarization wavefront B and birefringent characteristics (in this embodiment, the magnitude A of retardation and the fast axis azimuth $\theta_0$) by fitting the phases WP1, WP2, and WP3 corrected in step S1008, using equation (10). In FIG. 3, the non-polarization wavefront B is 0 (the center value between the maximum phase value and minimum phase value), the magnitude A of retardation is ((the maximum phase value)+(the minimum phase value))/2, and the fast axis azimuth $\theta_0$ is the azimuth of linearly polarized light at the maximum value of the first phase. The non-polarization wavefront and birefringent characteristics of the optical system TOS to be measured can thus be obtained at each of its pupil points.

In step S1012, the control unit 80 calculates the wavefront phase of the optical system TOS to be measured with respect to arbitrary linearly polarized light or arbitrary polarized light at each of its pupil points, based on the non-polarization wavefront and birefringent characteristics obtained in step S1010. The polarization wavefront of the optical system TOS to be measured with respect to arbitrary polarized light can thus be obtained by calculating the phases with respect to arbitrary linearly polarized light or arbitrary polarized light over the entire pupil plane of the optical system TOS to be measured.

As has been described above, the measurement apparatus 1 shown in FIG. 1 and the measurement method shown in FIG. 2 measure the wavefronts of the optical system TOS to be measured with respect to linearly polarized light beams along three different azimuths to calculate the polarization wavefront of the optical system TOS to be measured with respect to arbitrary polarized light. This makes it possible to measure the polarization wavefront of the optical system TOS to be measured in a short period of time. It is also possible to simply measure the polarization wavefront of the optical system TOS to be measured because there is no need to know in advance the fast axis azimuth of the birefringence of the optical system TOS to be measured.

The wavefront of the optical system TOS to be measured needs to be measured by measuring the difference between the phase of light which enters the optical system TOS to be measured in its polarization direction and that of the light which emerges from the optical system TOS to be measured in the same polarization direction. For this purpose, a general measurement apparatus needs to have an analyzer which detects only the phase of light which enters the optical system TOS to be measured in its polarization direction. However, since the interferometer unit 20 of the measurement apparatus 1 is a double-pass interferometer, the measurement apparatus 1 need not have an analyzer. This is because the reference light is linearly polarized light. In this case, only a component of the measurement light in the same polarization direction as that of the reference light interferes with the reference light, and the phase of the light component in this polarization direction is measured. In other words, interference between the reference light and the measurement light plays the same role as an analyzer. Since the measurement apparatus 1 uses the Fizeau interferometer, the polarization state of the reference light is the same as that of the light which enters the optical system TOS to be measured. However, if the measurement apparatus 1 uses an interferometer of another scheme (e.g., the Twyman-Green interferometer), the interferometer need only have a unit for equalizing the polarization state of the reference light to that of the light which enters the optical system TOS to be measured. If a single-pass interferometer is used, the polarization wavefront of the optical system TOS to be measured can be measured in accordance with the flowchart shown in FIG. 2 by providing a unit for equalizing the polarization state of the reference light to that of the light which enters the optical system TOS to be measured, as described above.

Figure 4:
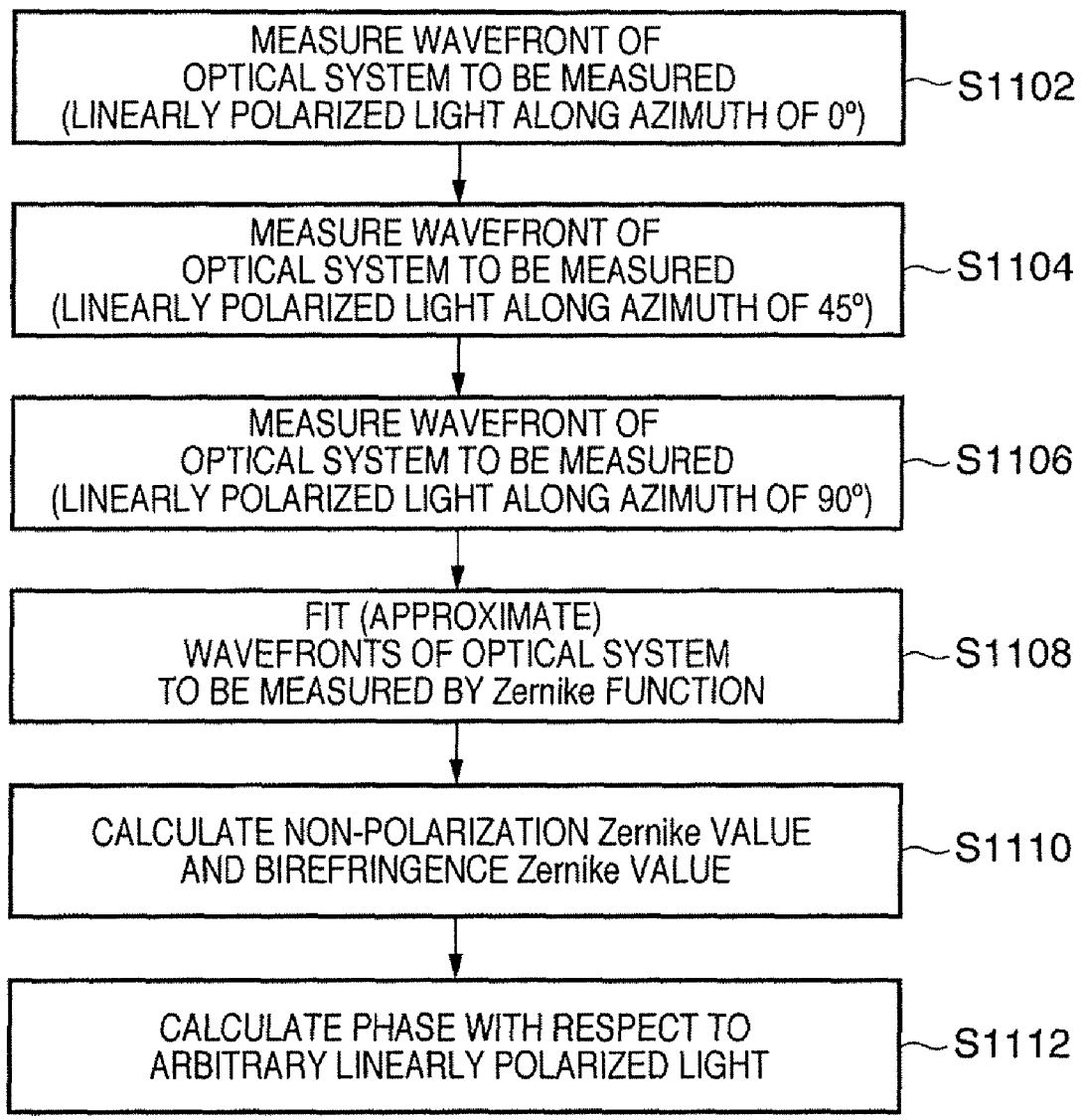
FIG. 4 is a flowchart for explaining a measurement method according to one aspect of the present invention.

Another process of calculating the polarization wavefront of the optical system TOS to be measured by the control unit 80 will be explained in detail below, together with the measurement operation of the measurement apparatus 1. FIG. 4 is a flowchart for explaining a measurement method according to one aspect of the present invention.

Referring to FIG. 4, the wavefront of the optical system TOS to be measured with respect to linearly polarized light along an azimuth of 0° is measured in step S1102. More specifically, first, the control unit 80 rotates the λ/2 plate 30 via the rotating mechanism 32 to guide linearly polarized light along an azimuth of 0° to the optical system TOS to be measured. In this state, an interference pattern is detected by the CCD camera 207 using the fringe scanning method, and the wavefront of the optical system TOS to be measured is calculated based on the interference pattern. Unlike the measurement method shown in FIG. 2, it is unnecessary to measure the positions of the TS lens 40 and RS mirror 50.

In step S1104, the wavefront of the optical system TOS to be measured with respect to linearly polarized light along an azimuth of 45° is measured. In step S1106, the wavefront of the optical system TOS to be measured with respect to linearly polarized light along an azimuth of 90° is measured. More specifically, in steps S1104 and S1106, the control unit 80 rotates the λ/2 plate 30 via the rotating mechanism 32 to guide linearly polarized light along an azimuth of 45° or 90° to the optical system TOS to be measured, thereby calculating the wavefront of the optical system TOS to be measured. As in step S1102, it is unnecessary to measure the positions of the TS lens 40 and RS mirror 50.

In step S1108, the wavefronts of the optical system TOS to be measured, which are obtained in steps S1102, S1104, and S1106, are fitted (approximated) by the Zernike function. In other words, in step S1108, a wavefront W(x,y) of the optical system TOS to be measured at a pupil coordinate position (x,y) of the optical system TOS to be measured is developed by the so-called Zernike orthogonal function into:

$$W(x,y)=Z1+Z2 \cdot r \cdot \cos\theta + Z3 \cdot r \cdot \sin\theta + Z4 \cdot (2r^2-1)+ Z5 \cdot r^2 \cdot \cos\theta + Z6 \cdot r^2 \cdot \sin\theta + Z7 \cdot (3r^3-2r+1) \cdot \cos\theta + Z8 \cdot (3r^3-2r+1) \cdot \sin\theta + \quad (11)$$

where Z1, Z2, . . . are Zernike coefficients.

Figure 5:
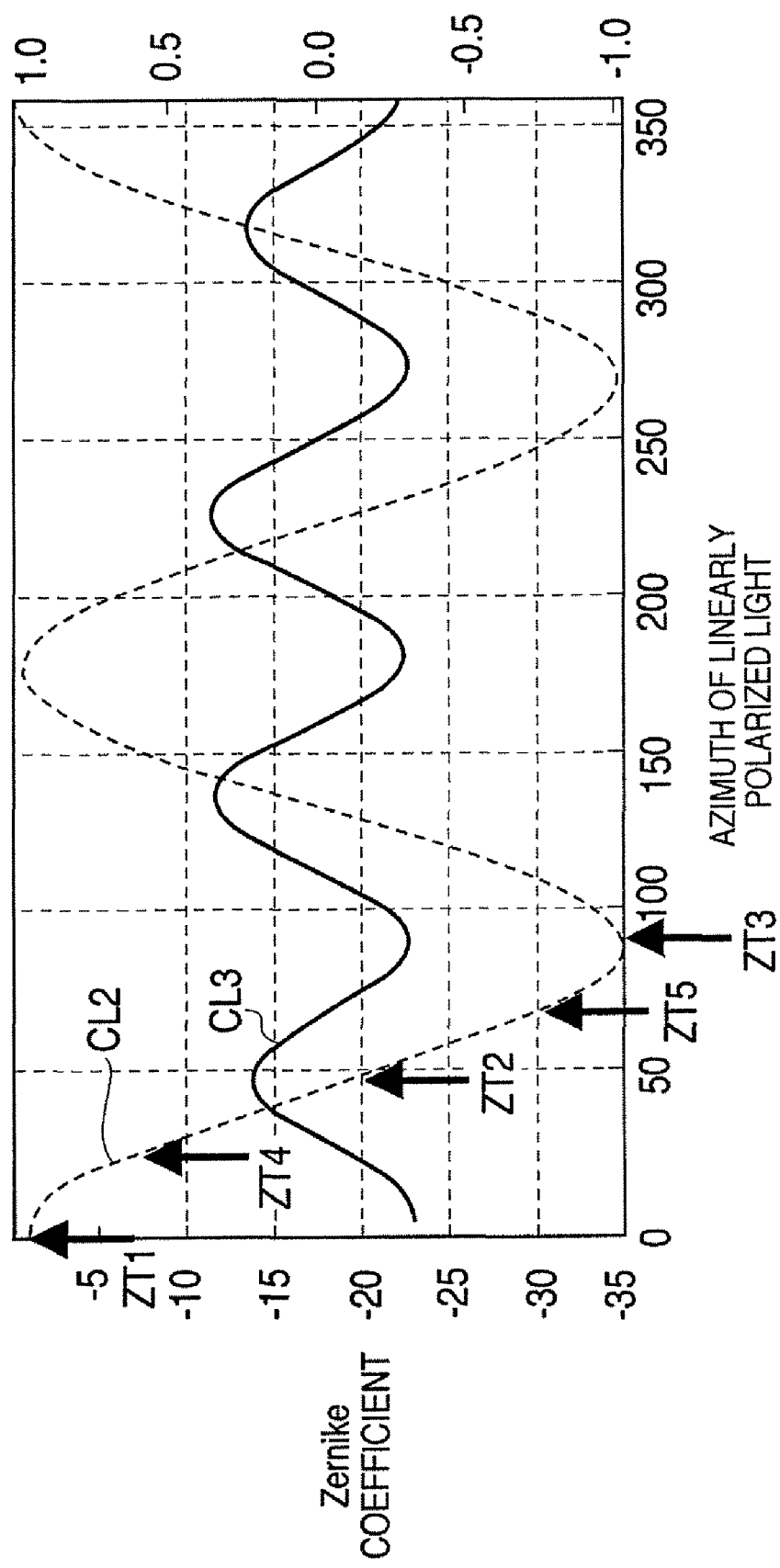
FIG. 5 is a graph showing the relationship between the Zernike coefficient and the azimuth of linearly polarized light which enters the optical system to be measured.

In step S1110, the control unit 80 calculates the non-polarization Zernike value (non-polarization wavefront) and the birefringence Zernike value (polarization wavefront) for the Zernike coefficient of each term obtained in step S1108. More specifically, the Zernike coefficients of arbitrary terms Zi (i: term number) with respect to linearly polarized light beams along azimuths of 0°, 45°, and 90°, which are obtained in step S1108, are indicated by ZT1, ZT2, and ZT3 in FIG. 5. Assuming that the optical system TOS to be measured exhibits a uniaxial birefringent characteristic, the Zernike coefficients ZT1, ZT2, and ZT3 are plotted on a sine wave (sine curve) CL1, as shown in FIG. 5. Hence, the Zernike coefficient Zi can be expressed as a function of an azimuth θ of linearly polarized light which enters the optical system TOS to be measured:

$$Zi(\theta)=A_{1i} \cdot \sin(\theta+\theta_{1i})+B_{1i} \quad (12)$$

where $\theta_{1i}$ and $A_{1i}$ are the birefringence Zernike values with respect to the ith Zernike coefficient, which indicate the fast axis azimuth and the magnitude of retardation, respectively, and $B_{1i}$ is the non-polarization Zernike value. FIG. 5 is a graph showing the relationship between the azimuth of linearly polarized light which enters the optical system TOS to be measured and the Zernike coefficient (the Zernike coefficients obtained in step S1108). In FIG. 5, the abscissa indicates the azimuth of linearly polarized light which enters the optical system TOS to be measured, and the ordinate indicates the Zernike coefficient.

The control unit 80 can calculate the non-polarization Zernike value and birefringence Zernike value for the Zernike coefficient of each term by fitting the Zernike coefficients ZT1, ZT2, and ZT3 obtained in step S1108, using equation (12). In FIG. 5, the non-polarization Zernike value (non-polarization wavefront) $B_{1i}$ is −20 mλ (((maximum value)+(minimum value))/2), the magnitude $A_{1i}$ of retardation is 20 mλ (((maximum value)−(minimum value))/2), and the fast axis azimuth $θ_{1i}$ is 0° (the azimuth of linearly polarized light at the maximum value of the first phase).

If the optical system TOS to be measured exhibits a multiaxial birefringent characteristic, the wavefronts of the optical system TOS to be measured with respect to linearly polarized light beams along different azimuths are measured, in addition to steps S1102, S1104, and S1106. This makes it possible to calculate the non-polarization Zernike value and birefringence Zernike value with a higher precision.

More specifically, if the optical system TOS to be measured exhibits a biaxial birefringent characteristic, the wavefronts of the optical system TOS to be measured with respect to linearly polarized light beams along five or more azimuths are measured. For example, the wavefronts of the optical system TOS to be measured with respect to linearly polarized light beams along azimuths of 22.5° and 67.5° are measured, in addition to linearly polarized light beams along azimuths of 0°, 45°, and 90°. The Zernike coefficients with respect to linearly polarized light beams along azimuths 22.5° and 67.5° are indicated by ZT4 and ZT5 in FIG. 5. The non-polarization Zernike value and birefringence Zernike value are calculated based on these Zernike coefficients ZT1 to ZT5 (step S1110). At this time, the control unit 80 fits the Zernike coefficients ZT1 to ZT5 by:

$$Zi(θ)=A_{1i}·\sin(θ+θ_{1i})+A_{2i}·\sin(2(θ+θ_{2i}))+B_{1i} \quad (13)$$

where $A_{1i}$ and $θ_{1i}$ are the fast axis azimuth and the magnitude of retardation of the 1θ component of the birefringence Zernike value, $A_{2i}$ and $θ_{2i}$ are the fast axis azimuth and the magnitude of retardation of the 2θ component of the birefringence Zernike value, and $B_{1i}$ is the non-polarization Zernike value (non-polarization wavefront).

FIG. 5 shows the result of fitting by equation (13). A curve CL2 is the sum of the first term and the third term shown in equation (13), and a curve CL3 is the second term shown in equation (13). The 2θ component as the second term is generally smaller than the 1θ component. In FIG. 5, the left ordinate indicates a scale corresponding to the 1θ component, and the right ordinate indicates a scale corresponding to the 2θ component.

The values of $A_{1i}$, $θ_{1i}$, $A_{2i}$, and $B_{1i}$ in equation (13) can be calculated for the Zernike coefficient of each term in step S1110.

In step S1112, the control unit 80 calculates the phase with respect to arbitrary linearly polarized light or arbitrary polarized light at each pupil point of the optical system TOS to be measured, based on the non-polarization Zernike value and birefringence Zernike value obtained in step S1110. The polarization wavefront of the optical system TOS to be measured with respect to arbitrary polarized light can thus be obtained by calculating the phases with respect to arbitrary linearly polarized light or arbitrary polarized light over the entire pupil plane of the optical system TOS to be measured.

More specifically, at a certain pupil point of the optical system TOS to be measured, an azimuth θ of linearly polarized light to be calculated and the non-polarization Zernike value and birefringence Zernike value obtained in step S1110 are substituted for equation (12) or (13). The Zernike coefficient $(Zi(θ))$ of a term number i is then calculated. The Zernike coefficients of all the term numbers (e.g., 5 to 36) are calculated to calculate the wavefront phase of the optical system TOS to be measured at the pupil coordinate position (x,y), thereby calculating the sum of the term numbers at each pupil point of the optical system TOS to be measured. This makes it possible to obtain the non-polarization wavefront and polarization wavefront of the optical system TOS to be measured, which has even a multiaxial birefringent characteristic. If the optical system TOS to be measured has a two-or-more-multiaxial birefringent characteristic, linearly polarized light beams along seven or more azimuths need only be guided to the optical system TOS to be measured. In other words, the wavefronts of the optical system TOS to be measured with respect to linearly polarized light beams along seven or more different azimuths need only be measured.

As described above, the measurement method shown in FIG. 4 does not measure the positions of the TS lens 40 and RS mirror 50 in steps S1102, S1104, and S1106. However, if one wants to calculate the tilt and power components (the second, third, and fourth terms of the Zernike coefficients) of the birefringent characteristics, the positions of the TS lens 40 and RS mirror 50 need only be measured in steps S1102, S1104, and S1106. Then, the tilt and power components $Z2(θ)$, $Z3(e)$, and $Z4(θ)$ of the Zernike coefficients with respect to linearly polarized light beams along respective azimuths need only be corrected based on the positions of the TS lens 40 and RS mirror 50, as in the measurement method shown in FIG. 2.

As has been described above, the measurement method shown in FIG. 4 measures the wavefronts of the optical system TOS to be measured with respect to linearly polarized light beams along at least three different azimuths to calculate the polarization wavefront of the optical system TOS to be measured with respect to arbitrary polarized light. This makes it possible to measure the polarization wavefront of the optical system TOS to be measured in a short period of time. It is also possible to simply measure the polarization wavefront of the optical system TOS to be measured because there is no need to know in advance the fast axis azimuth of the birefringence of the optical system TOS to be measured.

In the above-described measurement method, the interferometer measures the non-polarization wavefront and birefringent characteristics of the optical system TOS to be measured. However, the polarization wavefront of the optical system TOS to be measured with respect to arbitrary polarized light may be calculated by calculating the birefringent characteristics of the optical system TOS to be measured using an arbitrary polarization analysis method, and measuring the non-polarization wavefront or the wavefront of the optical system TOS to be measured with respect to known polarized light. More specifically, the Jones Matrix of the optical system TOS to be measured is measured by a polarization analysis method, and the measured Jones Matrix is normalized by the wavefront of the optical system TOS to be measured with respect to known polarized light. The polarization wavefront of the optical system TOS to be measured with respect to arbitrary polarized light is calculated based on the normalized Jones Matrix.

Also in the above-described measurement method, the λ/2 plate 30 is rotated to guide linearly polarized light beams along three different azimuths to the optical system TOS to be measured. However, as shown in FIG. 6, linearly polarized light along an arbitrary azimuth may be guided to the optical system TOS to be measured by fixing the azimuth of the linearly polarized light which enters the optical system TOS to be measured to a predetermined one, and rotating the optical system TOS to be measured about the optical axis.

Figure 6:
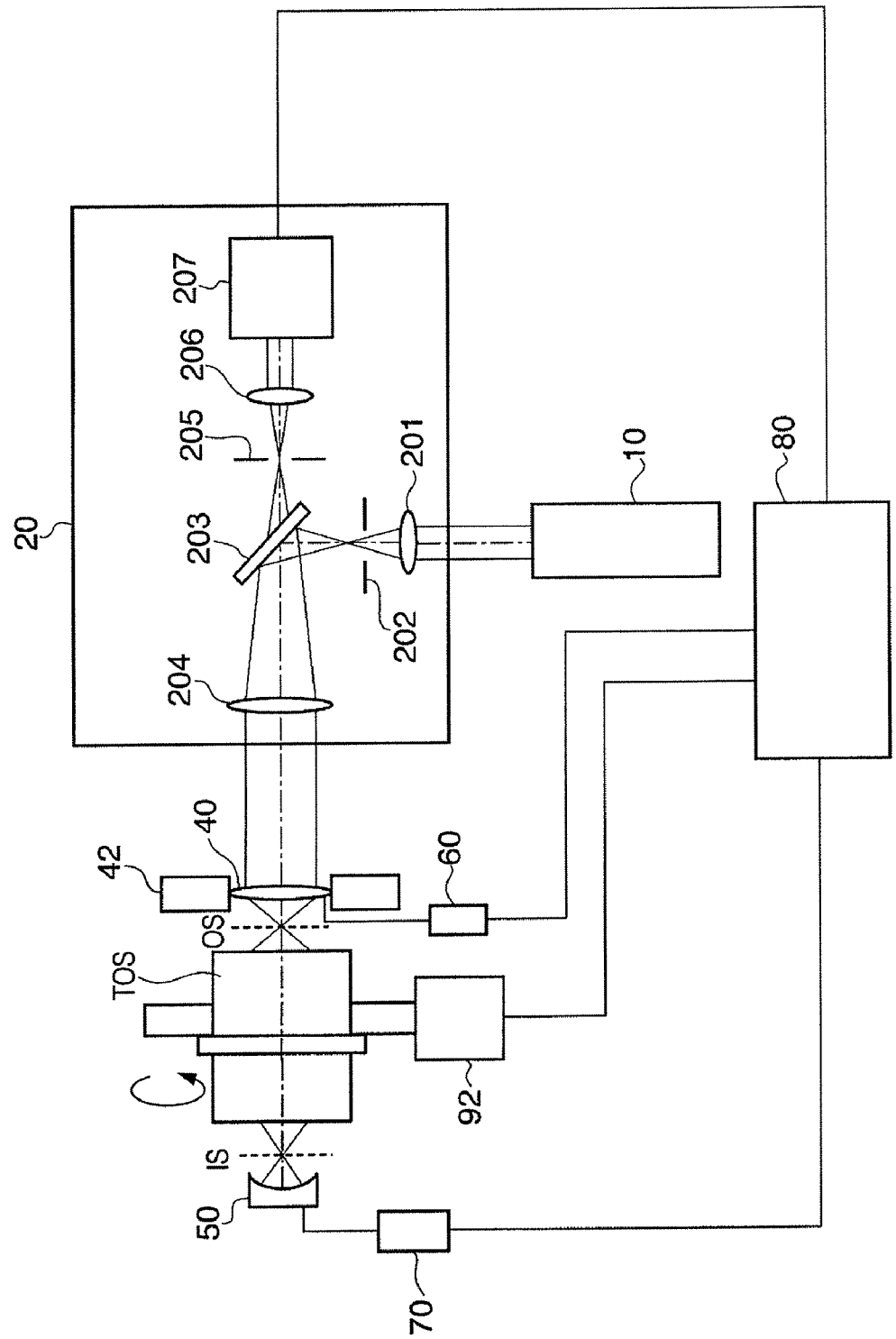
FIG. 6 is a schematic block diagram showing a measurement apparatus according to one aspect of the present invention.

FIG. 6 is a schematic block diagram showing the arrangement of a measurement apparatus 1A according to one aspect of the present invention.

The measurement apparatus 1A measures the optical performance of an optical system TOS to be measured. In this embodiment, the measurement apparatus 1A measures the wavefront aberration of the optical system TOS to be measured with respect to arbitrary polarized light. Like the measurement apparatus 1, the measurement apparatus 1A basically takes the Fizeau interferometer arrangement. As shown in FIG. 6, the measurement apparatus 1A includes a light source 10, interferometer unit 20, TS lens 40, RS mirror 50, lens position measurement unit 60, mirror position measurement unit 70, control unit 80, and rotation holding mechanism 92.

The rotation holding mechanism 92 holds the optical system TOS to be measured to be rotatable about the optical axis. More specifically, the rotation holding mechanism 92 rotates the optical system TOS to be measured through an arbitrary rotation angle and holds the optical system TOS to be measured at the arbitrary rotation angle under the control of the control unit 80.

As a method of measuring the wavefront aberration of the optical system TOS to be measured by the measurement apparatus 1A, the optical system TOS to be measured is rotated instead of rotating the $\lambda/2$ plate 30 in steps S1002 to S1006 or S1102 to S1106. More specifically, the wavefronts of the optical system TOS to be measured are measured by rotating the optical system TOS to be measured along azimuths of 0°, 45°, and 90° in steps S1002 to S1006 or S1102 to S1106.

Figure 7:
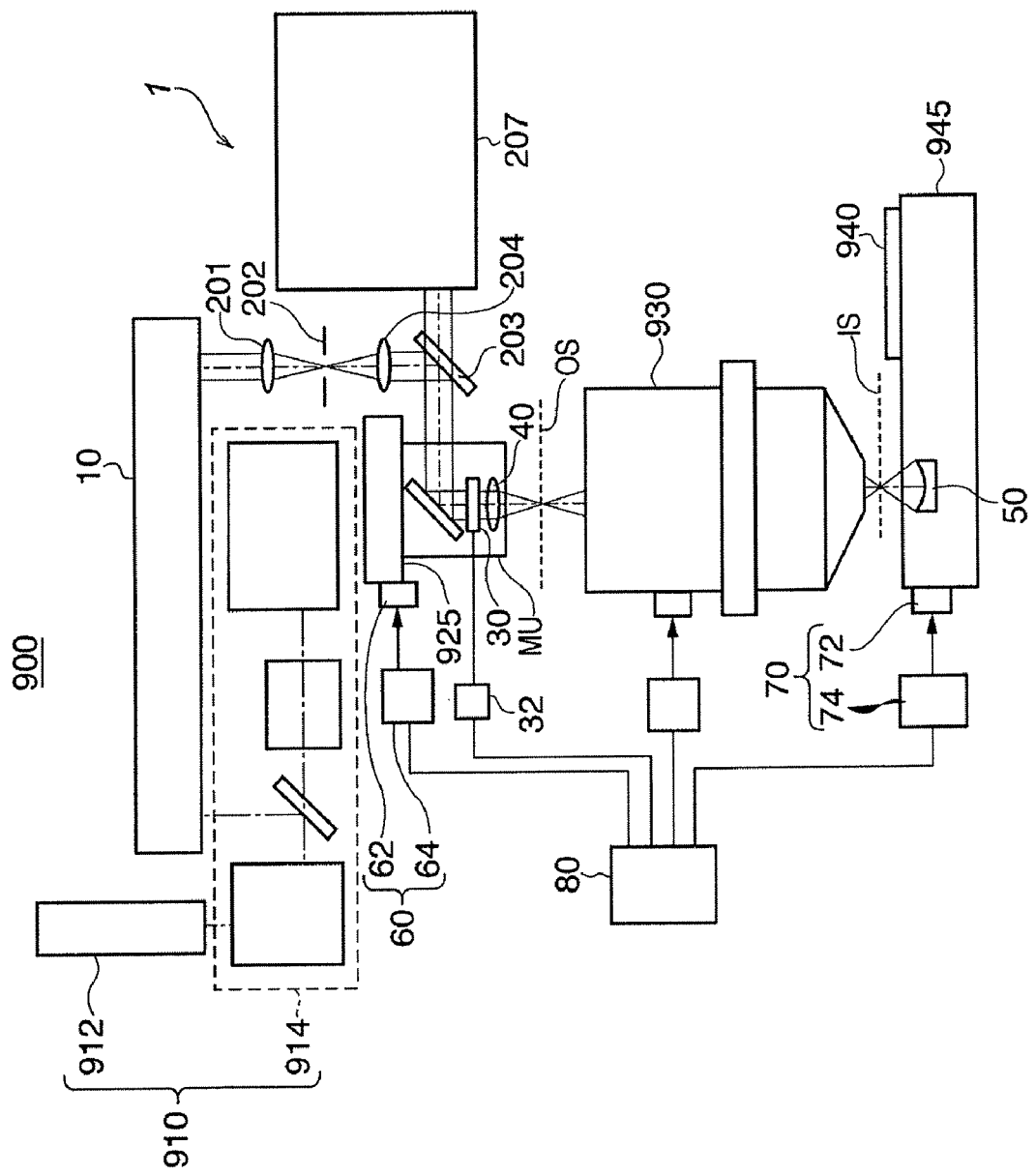
FIG. 7 is a schematic block diagram showing an exposure apparatus according to one aspect of the present invention.

An exposure apparatus to which a measurement apparatus according to the present invention is applied will be explained below. FIG. 7 is a schematic block diagram showing the arrangement of an exposure apparatus 900 according to one aspect of the present invention. In this embodiment, the exposure apparatus 900 is a projection exposure apparatus which transfers the pattern of a reticle onto a wafer 940 by the step & scan scheme. However, the exposure apparatus 900 can also adopt the step & repeat scheme.

The exposure apparatus 900 includes an illumination apparatus 910, a reticle stage 925 which supports the reticle and a measurement unit MU, a projection optical system 930, a wafer stage 945 which supports the wafer 940 and RS mirror 50, and the measurement apparatus 1. In this embodiment, the measurement unit MU includes the $\lambda/2$ plate 30 and TS lens 40. Although this embodiment will exemplify a case in which the measurement apparatus 1 is applied to the exposure apparatus 900, the measurement apparatus 1A is similarly applicable to the exposure apparatus 900.

The illumination apparatus 910 illuminates the reticle on which a circuit pattern to be transferred is formed, and includes a light source unit 912 and illumination optical system 914.

The light source unit 912 uses, for example, an excimer laser as a light source. The excimer laser includes, for example, a KrF excimer laser with a wavelength of about 248 nm, and an ArF excimer laser with a wavelength of about 193 nm. However, the light source of the light source unit 912 is not particularly limited to an excimer laser, and may be, for example, an $F_2$ laser with a wavelength of about 157 nm.

The illumination optical system 914 illuminates the reticle. In this embodiment, the illumination optical system 914 includes, for example, a light extension optical system, incoherent optical system, and polarized illumination optical system. The exposure apparatus 900 can use a low-coherency light source unit 912 as the light source 10 of the measurement apparatus 1. In this case, an optical path switching mirror is inserted in the illumination optical system 914 so that the mirror guides light from the light source unit 912 to the condenser lens 201.

The reticle has a circuit pattern and is supported and driven by the reticle stage 925. Diffracted light generated by the reticle is projected onto the wafer 940 via the projection optical system 930. Since the exposure apparatus 900 is of the step & scan scheme, it transfers the reticle pattern onto the wafer 940 by scanning them.

The reticle stage 925 supports the reticle and measurement unit MU and is connected to a moving mechanism (not shown). The moving mechanism (not shown) includes, for example, linear motors and drives the reticle stage 925 in the X, Y, and Z directions. In transferring the reticle pattern onto the wafer 940 by exposure, the reticle stage 925 inserts the reticle onto an object plane OS of the projection optical system 930. In measuring the wavefront aberration of the projection optical system 930, the reticle stage 925 inserts the measurement unit MU on the side of the object plane OS of the projection optical system 930.

The projection optical system 930 projects the reticle pattern onto the wafer 940. The projection optical system 930 can be a dioptric system, catadioptric system, or catoptric system. The measurement apparatus 1 measures the wavefront aberration (particularly the polarization wavefront with respect to arbitrary polarized light) of the projection optical system 930 with high precision, and the wavefront aberration is adjusted based on the measurement result.

In this embodiment, the wafer 940 is used as a substrate. However, it is also possible to use a glass plate or other substrates in place of the wafer 940. The wafer 940 is coated with a photoresist.

The wafer stage 945 supports the wafer 940 and RS mirror 50 and drives them using, for example, linear motors. In transferring the reticle pattern onto the wafer 940 by exposure, the wafer stage 945 inserts the wafer 940 onto an image plane IS of the projection optical system 930. In measuring the wavefront aberration of the projection optical system 930, the wafer stage 945 inserts the RS mirror 50 on the side of the image plane IS of the projection optical system 930.

The measurement apparatus 1 measures the wavefront aberration of the optical system TOS to be measured. The measurement apparatus 1 includes the light source 10, condenser lens 201, spatial filter 202, half mirror 203, collimator lens 204, CCD camera 207, $\lambda/2$ plate 30, TS lens 40, and RS mirror 50. The measurement apparatus 1 also includes the lens position measurement unit 60, mirror position measurement unit 70, and control unit 80. In this embodiment, the lens position measurement unit 60 includes a reference mirror 62 arranged on the reticle stage 925, and a sensor 64 for irradiating the reference mirror 62 with light and detecting the light reflected by the reference mirror 62. Also in this embodiment, the mirror position measurement unit 70 includes a reference mirror 72 arranged on the wafer stage 945, and a sensor 74 for irradiating the reference mirror 72 with light and detecting the light reflected by the reference mirror 72. The measurement apparatus 1 may also include an optical system position measurement unit which has a reference mirror and sensor and measures the position of the projection optical system 930. The detailed arrangement and operation of the measurement apparatus 1 are as above, and a detailed description thereof will not be given herein.

First, the exposure apparatus 900 measures the wavefront aberration of the projection optical system 930. Particularly in this embodiment, the polarization wavefront of the projection optical system 930 with respect to arbitrary polarized light is measured. The polarization wavefront of the projection optical system 930 is measured using the measurement apparatus 1, as described above. As the polarization wavefront of the projection optical system 930 is measured, the wavefront aberration of the projection optical system 930 is adjusted based on the measurement result. As described above, since the measurement apparatus 1 can measure the polarization wavefront of the projection optical system 930 with high precision, it can adjust the wavefront aberration of the projection optical system 930 with high precision.

The reticle pattern is then transferred onto the wafer 940 by exposure. A light beam emitted by the light source unit 912 illuminates the reticle via the illumination optical system 914. A light beam component reflecting the reticle pattern forms an image on the wafer 940 via the projection optical system 930. As described above, the wavefront aberration of the projection optical system 930 for use in the exposure apparatus 900 is adjusted with high precision, thus attaining an excellent imaging capability. Hence, the exposure apparatus 900 can provide devices (e.g., a semiconductor device, an LCD device, an image sensing device (e.g., a CCD), and a thin-film magnetic head) with high throughput, a good economical efficiency, and high quality.

A description will be given of an embodiment of a device fabrication method using the above mentioned exposure apparatus 900. The device is fabricated by a step of exposing a substrate coated with a resist (wafer or glass plate) using the exposure apparatus 900, a step of performing a development process for the substrate exposed, and a step of performing other well-known processes.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese application No. 2007-121164 filed on May 1, 2007, which is hereby incorporated by reference herein in its entirely.

What is claimed is:

1. A measurement method of measuring a wavefront aberration of an optical system to be measured, comprising:
    a first measurement step of measuring wavefronts of the optical system to be measured with respect to linearly polarized light beams along at least three different azimuths;
    a first calculation step of calculating a wavefront of the optical system to be measured with respect to non-polarized light and a birefringent characteristic of the optical system to be measured, based on the wavefronts of the optical system to be measured, which are measured in the first measurement step; and
    a second calculation step of calculating a wavefront of the optical system to be measured with respect to arbitrary polarized light, based on the wavefront and the birefringent characteristic of the optical system to be measured, which are calculated in the first calculation step.

2. The method according to claim 1, wherein the birefringent characteristic includes a magnitude of retardation of the optical system to be measured, and a fast axis azimuth of birefringence of the optical system to be measured.

3. The method according to claim 1, further comprising:
    a second measurement step of measuring positions, in measuring a wavefront of the optical system to be measured, of a condensing optical system configured to converge a certain component of each of the linearly polarized light beams along at least three azimuths on an object plane of the optical system to be measured to guide the certain component to the optical system to be measured, and to reflect the remaining component of each of the linearly polarized light beams along at least three azimuths without guiding the remaining component to the optical system to be measured, and a catoptric system configured to reflect the certain component of each of the linearly polarized light beams along at least three azimuths, which is guided to the optical system to be measured by the condensing optical system and has passed through the optical system to be measured, to guide the certain component to the optical system to be measured; and
    a correction step of correcting phases of the wavefronts of the optical system to be measured, which are measured in the first measurement step, at each pupil point of the optical system to be measured, based on the positions of the condensing optical system and the catoptric system measured in the second measurement step,
    wherein in the first calculation step, the phase at each pupil point of the optical system to be measured, which is corrected in the correction step, is fitted by:

$$\phi(\theta) = A \cdot \sin(\theta + \theta_0) + B$$

where $\theta$ is an azimuth of the linearly polarized light which enters the optical system to be measured, A is a magnitude of retardation of the optical system to be measured, B is the wavefront of the optical system to be measured, which is calculated in the first calculation step, $\theta_0$ is a fast axis azimuth of birefringence of the optical system to be measured, and $\phi(\theta)$ is a phase with respect to the azimuth of the linearly polarized light which enters the optical system to be measured.

4. The method according to claim 3, wherein in the correction step, the positions of the condensing optical system and the catoptric system measured in the second measurement step are converted into a tilt component and defocus component of the wavefront of the optical system to be measured, which is measured in the first measurement step.

5. The method according to claim 1, wherein in the first calculation step, the wavefront of the optical system to be measured, which is measured in the first measurement step, is fitted by a Zernike function.

6. The method according to claim 5, wherein in the first calculation step, the wavefront of the optical system to be measured, which is measured in the first measurement step, is fitted by:

$$Zi(\theta) = A_{1i} \cdot \sin(\theta + \theta_{1i}) + B_{1i}$$

where $\theta$ is an azimuth of the linearly polarized light which enters the optical system to be measured, $A_{1i}$ is a magnitude of retardation of the optical system to be measured, $B_{1i}$ is the wavefront of the optical system to be measured, which is calculated in the first calculation step, $\theta_{1i}$ is a fast axis azimuth of birefringence of the optical system to be measured, and $Zi(\theta)$ is a Zernike coefficient, which is obtained by fitting using the Zernike function, with respect to the azimuth of the linearly polarized light which enters the optical system to be measured.

* * * * *